United States Patent [19]
Henkelman et al.

[11] Patent Number: 5,900,731
[45] Date of Patent: May 4, 1999

[54] ENCODING FLOW INFORMATION USING MR SIGNAL MAGNITUDE

[75] Inventors: Ross Mark Henkelman, Toronto; Bruno Madore, North York, both of Canada

[73] Assignee: General Electric Company, Milwaukee, Wis.

[21] Appl. No.: 08/773,795

[22] Filed: Dec. 17, 1996

[51] Int. Cl.$^6$ ....................................................... G01V 3/00
[52] U.S. Cl. .......................................... 324/306; 324/307
[58] Field of Search ................................... 324/306, 307, 324/309, 312, 318, 300

[56] References Cited

U.S. PATENT DOCUMENTS

| | | | |
|---|---|---|---|
| 4,800,889 | 1/1989 | Dumoulin et al. | 324/306 |
| 5,101,156 | 3/1992 | Pelc | 324/306 |
| 5,408,180 | 4/1995 | Mistretta et al. | 324/309 |

*Primary Examiner*—Louis Arana
*Attorney, Agent, or Firm*—James O. Skarsten; Christian G. Cabou; Phyllis Y. Price

[57] ABSTRACT

A method is provided for use in constructing an MR image associated with the flow of blood or other fluid through an imaging volume, wherein material flowing through a selected voxel of the imaging volume is distinguished from static material. The method includes the step of applying a first MR pulse sequence to the imaging volume to produce a first MR data signal, having a magnitude which encodes first and second flow parameters for respective voxels comprising the volume, and having a phase which encodes a third flow parameter. The method further includes the step of applying a second MR pulse sequence to the volume, to produce a second MR data signal which indicates the content of respective voxels without flow encoding. The first and second MR data signals are compared to one another, such as by computing the difference therebetween, to determine the presence or absence of flowing material in respective voxels of the imaging volume. Information generated by such comparison is employed to construct an MR image which shows the flowing material.

18 Claims, 5 Drawing Sheets

ENCODING FLOW INFORMATION USING MR SIGNAL MAGNITUDE

BACKGROUND OF THE INVENTION

The invention disclosed and claimed herein is generally directed to a technique for acquiring magnetic resonance (MR) signal data relating to the flow of blood or other fluid within an imaging subject, wherein flow velocity or other parameter is encoded in the MR signals. More particularly, the invention pertains to a technique of the above type, wherein flow velocity information is encoded in the magnitude as well as the phase of respective MR signals. As is well known, acquired MR imaging data can be represented in quadrature. That is, the MR signal at each voxel location of an imaging slice can be represented by two complex components which are ninety degrees out of phase, referred to herein as $C_1$ and $C_2$, respectively. Thus, the MR signal at the jth voxel has a magnitude $I_j$ equal to $$\sqrt{C_1^2 + C_2^2},$$

and a phase component $\phi_j$ equal to the arctangent of $(C_2/C_1)$, or $\tan^{-1}(C_2/C_1)$. Accordingly $S_j$ can be expressed as $S_j = I_j e^{-i\Phi^j}$.

MR signal phase component is now used in the field of phase contrast (PC) angiography. Such field pertains to generation of an image which represents the flow of blood or other fluid through a vessel, and more specifically represents fluid velocity, rate of flow, or other flow parameter. As is further well known, if blood is flowing through the jth voxel, an associated signal $S_j$ can be acquired wherein the phase $\phi_j$ is a function of flow velocity at the jth voxel $v_j$. Thus, velocity is encoded in the phase, i.e., $\phi_j = \Phi(v_j)$.

In accordance with conventional PC angiography, two consecutive MR experiments or sequences are applied to an imaging volume to produce two successive signals $S_{1j}$ and $S_{2j}$, associated with the jth voxel. The first experiment employs a positive flow encoding gradient pulse, and the second experiment employs an identical gradient pulse, but of negative sign. Thus, signals are provided wherein $S_{1j} = I_{js} + I_{1jm} e^{-i\Phi(v_j)}$ and $S_{2j} = I_{2js} + I_{2jm} e^{+i\Phi(v_j)}$. The terms $I_{1js}$ and $I_{2j}$ represent the signal components resulting from static or non-moving spins and are the same for both experiments, i.e., $I_{1js} = I_{2js}$. Also, in conventional PC angiography, signal magnitude is not affected by flow velocity, so that $I_{1jm} = I_{2jm} = I_j$. Accordingly, the difference between $S_{1j}$ and $S_{2j}$, i.e. $\{I_{1js} + I_j e^{-\Phi(v_j)}\} - \{I_{2js} + I_j e^{+\Phi(v_j)}\} = I_j \{e^{-\Phi(v_j)} - e^{+i\Phi(v_j)}\}$, provides an expression from which static effects are eliminated, and from which the flow velocity may be computed.

Flow velocity $v_j$ generally comprises components $v_x$, $v_y$, and $v_z$, relative to the X-, Y-, Z- gradient axes, respectively. Practical implementation of the above technique requires computation of each velocity component, so that it is necessary to apply X-, Y-, and Z-gradients sequentially. As a result, the imaging time required to construct an angiogram is comparatively long. Under conventional practice, it is necessary to acquire at least four images, in order to obtain the velocity component information required to compute the velocity $v_j$ value for each of the voxels of a single angiogram. Imaging time thus constitutes one of the major limitations of PC angiography.

SUMMARY OF THE INVENTION

The present invention provides a method for use in connection with an MR imaging arrangement to construct an MR image of a fluid flowing through an imaging volume, wherein material flowing through a selected voxel is distinguished from static material. The method enables the presence or absence of flowing material to be detected for each of the voxels of the imaging volume. The method includes the step of applying a first MR pulse sequence to the imaging volume to produce a first MR data signal having a magnitude which encodes first and second flow parameters for respective voxels, and a phase which encodes the value of a third flow parameter. The method further includes the step of applying a second MR pulse sequence to the imaging volume to produce a second MR data signal which gives the content of respective voxels without flow encoding. Neither the magnitude nor the phase of the second signal encodes the first, second, or third flow parameters. The first and second MR data signals are selectively combined to provide a resultant MR data signal, which represents only MR effects of the flowing material, and does not represent MR effects of the static material. The resultant signal is employed in constructing the MR image.

In a preferred embodiment, the first, second, and third flow parameters comprise components of the flow relative to X-, Y-, and Z-gradient axes, respectively. The first MR sequence comprises X-, Y-, and Z-gradient pulse pairs, an excitation signal of a specified flip angle preceding each pulse pair, and RF inversion pulses respectively associated with the X- and Y-gradient pulse pairs. Both pulses of the X- and Y- gradient pulse pairs are of the same polarity, and the two pulses of the Z-gradient pulse pair are of opposite polarity. The second sequence comprises X- and Y-gradient pulse pairs which are substantially the same as the X- and Y-gradient pulse pairs of the first MR sequence, respectively. The second MR sequence further comprises an RF excitation signal having a flip angle which is substantially equal to the specified flip angle of the first sequence multiplied by a factor of three. However, such excitation signal occurs after the X- and Y-gradient pulses, so that it does not produce a velocity encoded MR signal. In a useful embodiment, the method is used to provide an image of blood flowing in an artery or other vessel, wherein the image depicts flow in a material at respective image positions.

OBJECTS OF THE INVENTION

An object of the invention is to provide an improved method of phase contrast angiography that substantially reduces imaging time.

Another object is to provide a method of the above type which reduces imaging time by employing the magnitude component of acquired MR signals to encode velocity or other flow-related information.

Another object is to provide a method of the above type for more quickly detecting the presence or absence of flowing material in respective voxels of an imaging volume.

These and other objects of the invention will become more readily apparent from the ensuing specification, taken together with the accompanying drawings.

DETAILED DESCRIPTION OF THE PREFERRED EMBODIMENT

Figure 1:
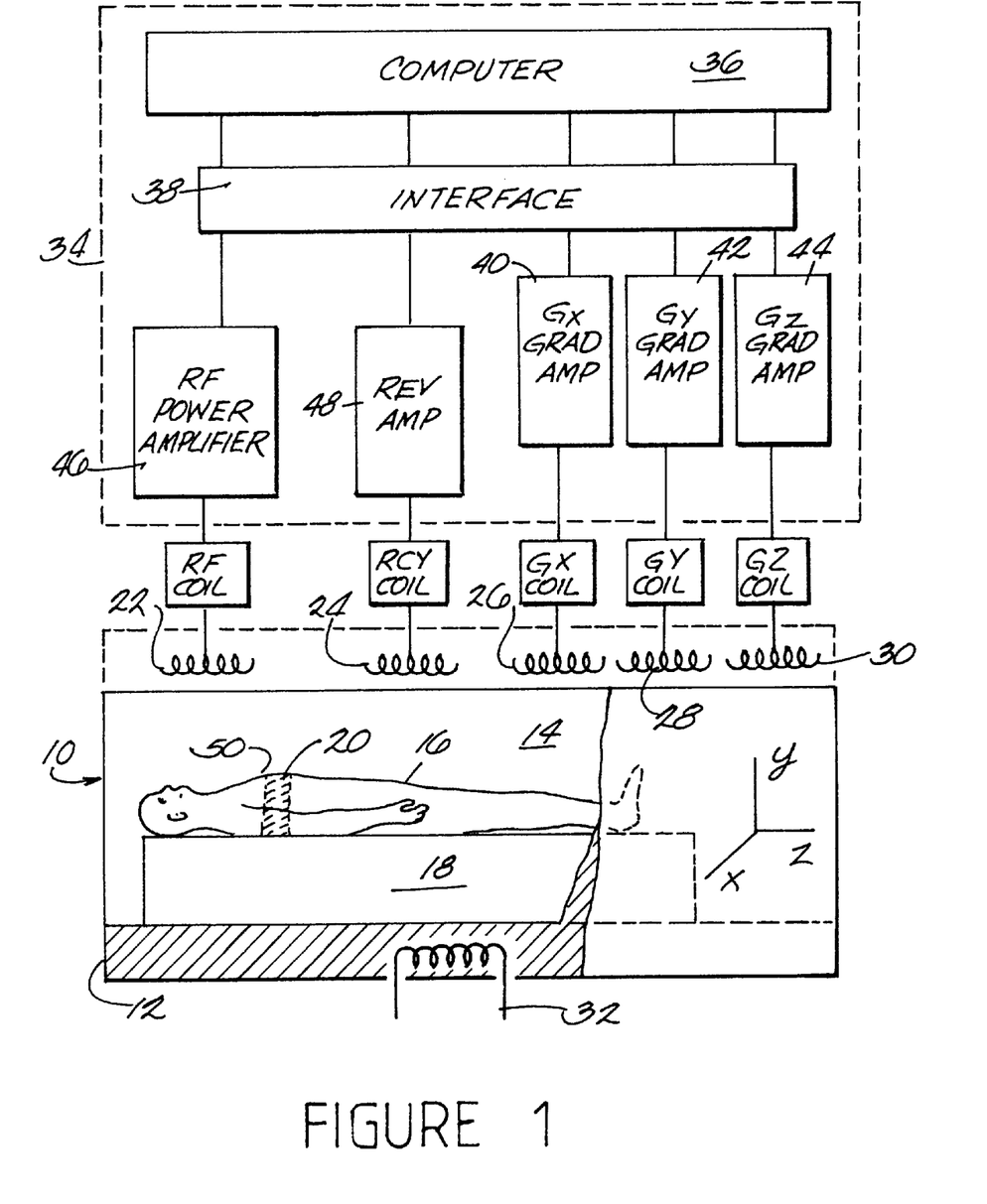
FIG. 1 is a perspective view showing selected components of an MR system for use in practicing an embodiment of the invention.

Referring to FIG. 1, there are shown the principal components of an MR imaging system 10, which may be used for practicing the embodiment of the invention described herein. System 10 includes a main magnet 12 provided with a bore 14. A patient or imaging subject 16 is positioned on a couch or other patient support structure 18 in the bore 14, so that an MR image can be generated of a section taken through the patient 16 and within an imaging volume 20. MR system 10 further includes an RF excitation coil 22, a receive coil 24, X-, Y-, and Z-gradient coils 26, 28, and 30, respectively, and a static main magnet coil 32. All of the coils 22 and 26–30 are incorporated into magnet 12, and are energized to project respective magnetic fields into bore 14 and more specifically into imaging volume 20. Receive coil 24 is likewise incorporated into magnet 12, to detect or acquire MR data signals generated within the magnet bore 14 in response to the projected magnetic field.

Referring further to FIG. 1, there is shown MR system 10 additionally comprising a system electronics package 34, which includes a computer 36 interactively coupled to an interface 38. Package 34 also includes gradient amplifiers 40, 42, and 44, each coupled to computer 36 through interface 38 to respectively energize gradient coils 26, 28, and 30. The electronics package 34 further comprises an RF power amplifier 46, coupled to energize coil 22 to produce RF excitation pulses, and a receive amplifier 48 for amplifying MR data signals detected by receive coil 24.

As is well known, a single coil can be substituted for RF excitation coil 22 and receive coil 24. In such modification, a switching mechanism (not shown) is provided to alternately couple excitation amplifier 46 and receive amplifier 48 to such single coil. It is to be understood that system electronics 34 is likely to include other components which are not shown for purposes of simplification. FIG. 1 also shows rectangular coordinate X-, Y-, and Z-axes which are in mutually orthogonal relationship with one another, the Z-axis being directed along the axis of bore 14.

Figure 2:
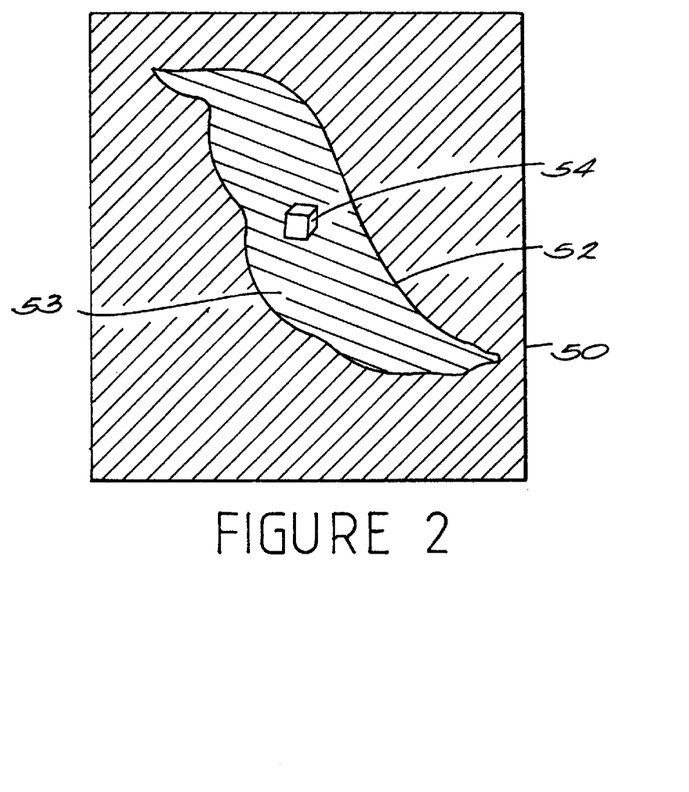
FIG. 2 shows an image of a section or slice taken through an MR imaging subject which includes a vessel with flowing blood or other fluid.

Referring to FIG. 2, there is shown a slice or section 50 which is taken through patient 16 and lies in imaging volume 20. Slice 50 includes a section of a blood vessel 52, wherein blood 53 is flowing through the vessel. FIG. 2 further shows a small volume element or voxel 54 of the slice 50 which lies within vessel 52. If voxel 54 is the jth voxel of the slice, the velocity of blood flowing through the vessel at the location of voxel 54 is $v_j$. It is desired to detect the presence or absence of flow for each of the voxels comprising slice 50, in order to construct an MR image thereof, or angiogram, which shows only the moving material located within slice 50.

Figure 3:
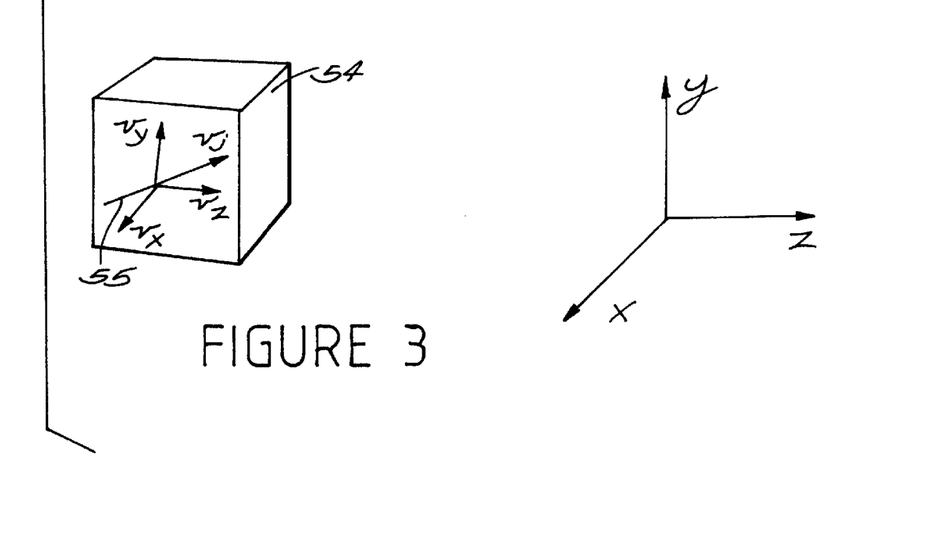
FIG. 3 is a view depicting flow velocity at a particular location of the image of FIG. 2.

Referring to FIG. 3, there is shown an enlarged view of the voxel 54, together with an arrow 55 representing the direction of flow velocity $v_j$. FIG. 3 further shows the respective components of velocity $v_j$ with respect to the X-, Y-, and Z-coordinate axes of MR system 10, i.e., $v_x$, $v_y$, and $v_z$, respectively.

Figure 4A:
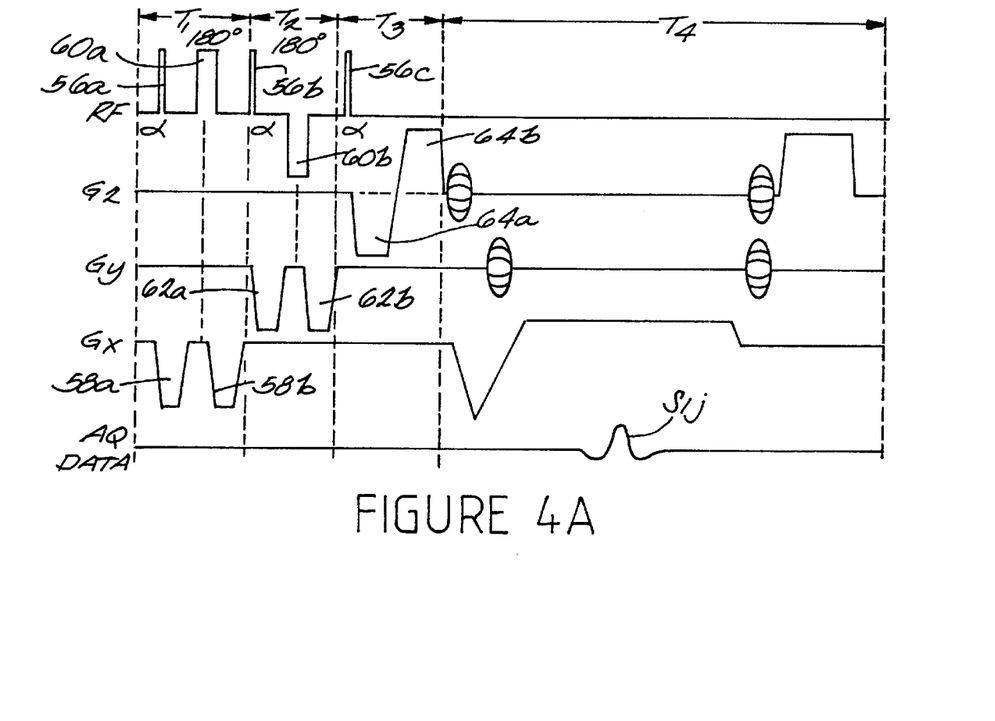
FIGS. 4A–4B show MR pulse sequences which collectively comprise an embodiment of the invention.

Referring to FIG. 4A, there is shown the first of two MR pulse sequences which collectively comprise an embodiment of the invention, and are successively applied to imaging volume 20 to acquire MR data for use in generating an angiogram. The sequence shown in FIG. 4A is a 3-D imaging sequence using a multiple component RF excitation pulse, and the pulses of the sequence are generated by the respectively corresponding coils of MR system 10. During a first time period $T_1$, an RF excitation pulse 56a having a flip angle α is produced, wherein α is usefully on the order of 5° to 10°. Such pulse is immediately followed by a bipolar X- gradient pulse comprising a pair of identical pulses or pulse lobes 58a and 58b, which are of the same polarity. A 180° RF inversion pulse 60a is generated midway between the X-gradient pulses 58a and 58b. During time period $T_2$, a second RF excitation pulse 56b is generated, likewise having a flip angle α and followed by a bipolar Y-gradient pulse, comprising pulses 62a and 62b. An 180° RF inversion pulse 60b, opposite in polarity from pulse 60a, is generated midway between the pulses 62a and 62b.

Referring further to FIG. 4A, there is shown a third RF pulse 56c generated during time period $T_3$, again having a flip angle α and followed by a pair of Z-gradient pulses 64a and 64b. The Z-gradient pulses are identical but of opposite polarity.

During time period $T_4$, a set of X-, Y-, and Z-gradient pulses are generated to spatially localize an acquired MR data signal $S_{1j}$, corresponding to the location of the jth voxel. A number of gradient pulse sequences for spatial localization, currently available in the art, may alternatively be employed. For example, a modified GRASS sequence may be used. As is known in the art, the GRASS sequence generally comprises the spin warp imaging technique, except that the flip angle of the RF excitation pulse is less than 90°. As stated above, the signal $S_{1j}$ comprises signal components $S_{1js}$ and $S_{1jm}$ which respectively result from spins in static material in the jth voxel, and from spins in material which is moving therethrough at the velocity $v_j$. As described hereinafter in further detail, the gradient pulses respectively generated during time periods $T_1$, $T_2$ and $T_3$ serve to detect whether a given voxel contains a component $S_{1jm}$.

Figure 5A:
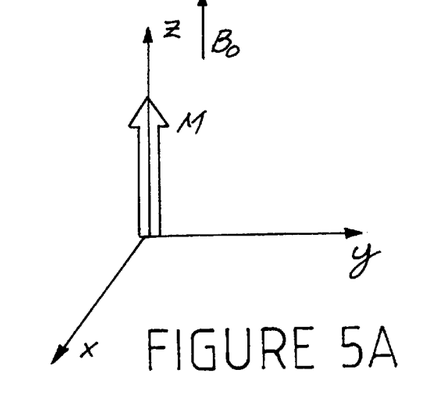
FIGS. 5A–5F and 6A–f6G are schematic representations useful for illustrating the embodiment of FIG. 4.
Figure 5B:
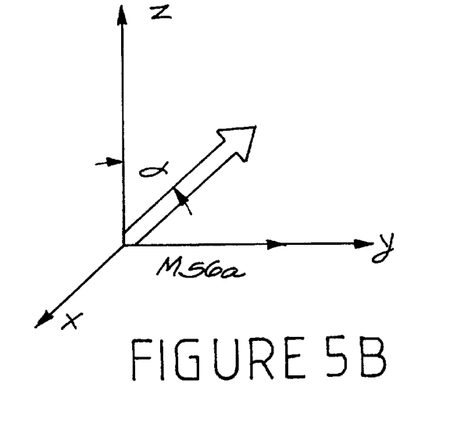

Referring to FIG. 5A, there is shown the condition with voxel 54, which is located inside bore 14 of the MR system 10, just prior to the time period $T_1$ of the sequence shown in FIG. 4A. More specifically, FIG. 5A depicts spins oriented along the Z-axis by the $B_0$ field produced by static field coil 32, to provide magnetization M. Referring to FIG. 5B, there is shown magnetization M oriented to an angle α with respect to the Z-axis, by application of RF excitation pulse 56a. The reoriented magnetization has a component $M_{56a}$ in the X-Y plane. Respective α excitation pulses are designed so that magnetization provided thereby in the X-Y plane will initially be aligned along the Y-axis.

Figure 5C:
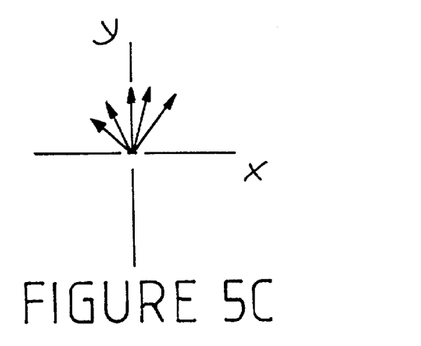
Figure 5D:
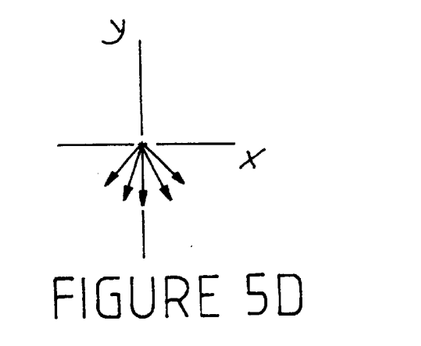
Figure 5E:
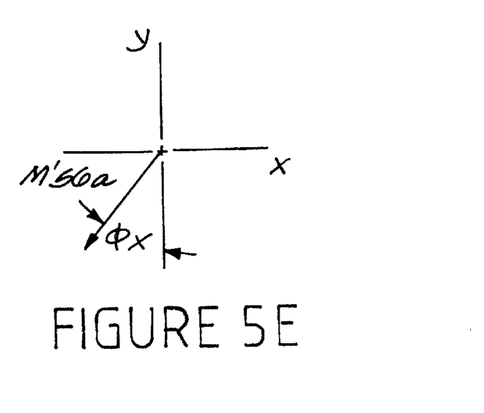
Figure 5F:
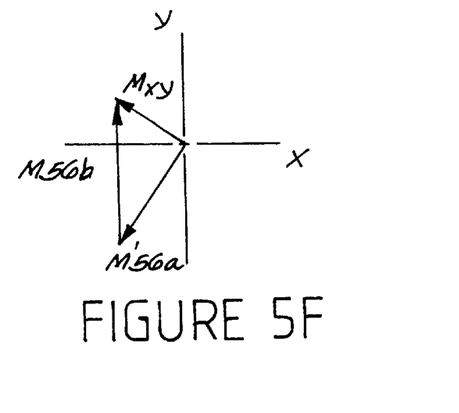

FIG. 5C depicts the dephasing of spins in response to the first X-gradient pulse 58a of time period $T_i$. FIG. 5D shows such magnetization inverted by application of the 180° pulse 60a. Thereafter, application of the second X-gradient pulse 56b results in rephasing or refocusing of spins in respect to the X-axis, to provide magnetization $M'_{56a}$, depicted in FIG. 5E. If the spins were all static or non-moving during time period $T_1$, they would all be realigned along the Y-axis by the gradient pulse 56b. However, because the spins are moving at velocity $v_j$, they realign instead on an axis making an angle $\phi_x$ with Y. FIG. 5F depicts the effect of the excitation pulse 56b, which brings a magnetization $M_{56b}$ in the X-Y plane. This magnetization is added to $M_{56}'$, in the X-Y plane. to give $M_{XY}$. The magnitude or intensity of $M_{XY}$ is dependent upon $\phi_x$, which in turn is a function of the X-component velocity $v_x$. The magnitude or intensity $I_{1jm}$ of the MR signal $S_{1jm}$ is in part determined by the magnitude of $M_{XY}$. Accordingly, MR signal magnitude is likewise a function of $V_x$.

In like manner, the magnetization $M_{XY}$ is modified to $M_{XY}'$ due to the combined effect of the pulses 62a and 62b, which rotate $M_{XY}$ according to the Y velocity $v_y$. The magnetization brought in the X-Y plane by the excitation pulse 56c adds with $M'_{XY}$ to give $M''_{XY}$. The magnitude or intensity of $M_{XY}''$ is then a function of both $v_x$ and $v_y$. Such function usefully is $I_{1jm}(\phi_x, \phi_y)+M(3\alpha^2=2 \cos\phi_x=2 \cos\phi_y=2 \cos(\phi_x=\phi_y))$.

As described above, the Z-gradient is reversed during time period $T_3$ of the sequence shown in FIG. 4A. Gradient reversal is a conventional technique, now well known in PC angiography for encoding a velocity component onto signal phase. Accordingly, the phase $\phi_{1j}$ of motion signal component $S_{1jm}$ is a function of velocity component $v_z$, which may be expressed as $\phi_{1jm}=\Phi(V_z)$. Thus, all three velocity components are encoded in signal $S_{1jm}=I_j(v_x,v_y)e^{-i\Phi(v_j)}$.

Figure 4B:
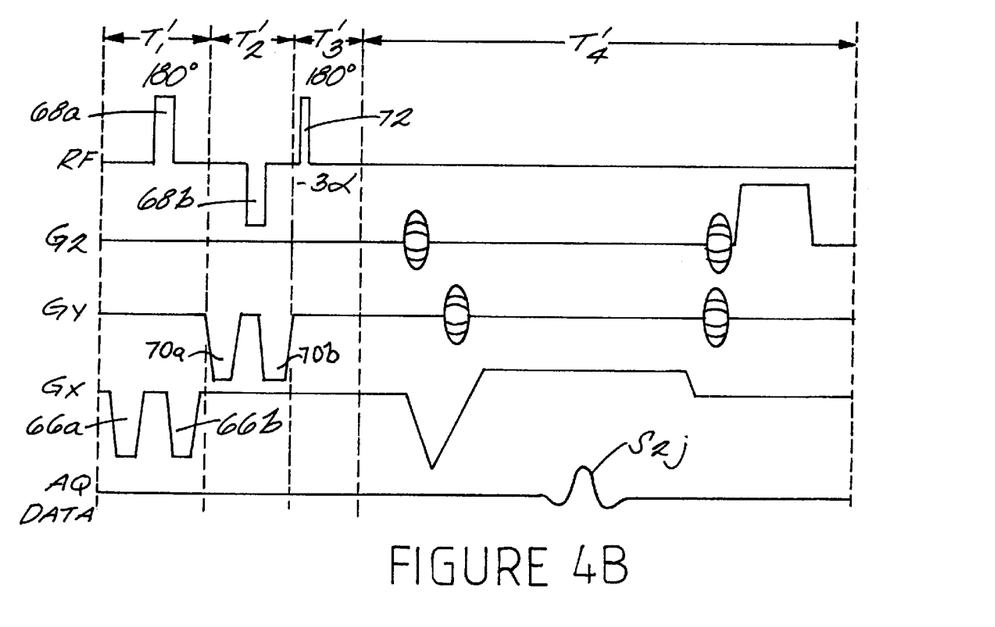

Referring to FIG. 4B, there is shown a sequence which commences following conclusion of the sequence shown in FIG. 4A. During a time period $T_1'$, bipolar X-gradient pulse 66a–b and RF inversion pulse 68a are generated, which are substantially identical to bipolar pulse 58a–b and inversion pulse 60a, respectively. Similarly, during a time period $T_2'$, bipolar Y-gradient pulse 70a–b and RF inversion pulse 68b are generated, which are substantially identical to bipolar pulse 62a–b and inversion pulse 60b, respectively. However, RF pulses equivalent to the α pulses 56a and 56b are not generated during time period $T_1'$ or $T_2'$. Instead, an RF excitation pulse 72 having a flip angle of 3α is generated thereafter, during time period $T_3'$. Also, the sequence of FIG. 4B does not include Z-gradient pulses for encoding the velocity component $v_z$ on the signal phase. During time period $T_4'$, a gradient spatial localization sequence is generated, which is substantially the same as the spatial localization sequence of time period $T_4$ described above.

The pulse sequence of FIG. 4B is not velocity encoded, since the magnetization excited by the 3α pulse 72 is not affected by, or does not "see," any bipolar gradient pulse. Thus, such pulse sequence is used to obtain a reference image, which is interleaved with the flow-encoded image acquired using the sequence of FIG. 4A. Thus, with regard to static RF material contained in a voxel, the magnetization thereof is not phase shifted by the bipolar gradient pulses of the sequence of FIG. 4A. The effect of the three α RF pulses in such sequence add coherently, resulting in a flip of such magnetization by an angle 3α. Neglecting T2* effects, the sequences of FIGS. 4A and 4B are then equivalent for static spins. However, for the sequence of FIG. 4A, a phase shift will occur between the αRF pulses 56a–c if there is a flow along the X- and/or Y- directions. If such a shift occurs, the effect of the three α RF pulses will not add coherently anymore and the magnetization flipped in the transverse plane will be diminished with respect to the reference case. A signal $S_{2j}$ comprising a static component $S_{2js}$ and a moving component $S_{2jm}$, is produced by applying the sequence of FIG. 4B to the jth voxel, and the presence of flowing material is detected when $S_{2j}$ is significantly different from $S_{1j}$.

Referring to FIGS. 6A–6G, there are shown respective sets of graphs which compare the effects of applying the MR pulse sequence of FIG. 4A to the flowing spins and to static spins in a voxel, respectively. Each graph depicts magnetization in the X-Y plane. Thus, the graph of FIG. 6A for flowing or moving spins shows the α pulse 56a flipping magnetization $M_m$ into the X-Y plane, which is aligned along the Y-axis as described above in connection with FIG.

5. The graph of FIG. 6A for the static case shows that α pulse 56a flips magnetization $M_s$ into the X-Y plane, which is likewise aligned along the Y-axis. The net effect of the bipolar X-gradient pulses 58a and 58b is to phase shift the magnetization $M_m$, as shown by the graph set of FIG. 6B. However, as described above in connection with static magnetization, the net effect of the gradient pulses 58a–b, in combination with inversion pulse 56a, is to dephase magnetization $M_s$, but to then refocus it along the Y-axis.

Figure 6A:
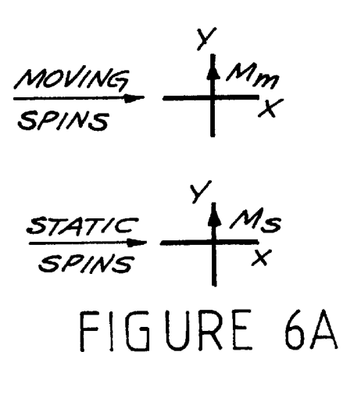
Figure 6B:
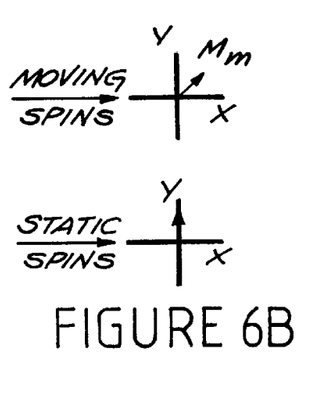
Figure 6C:
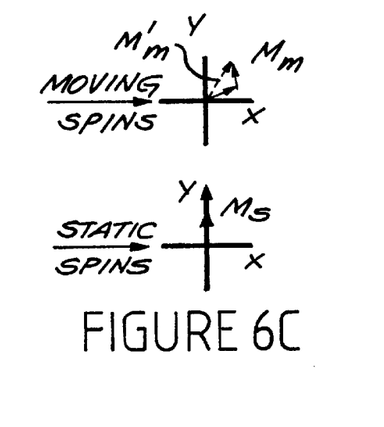
Figure 6D:
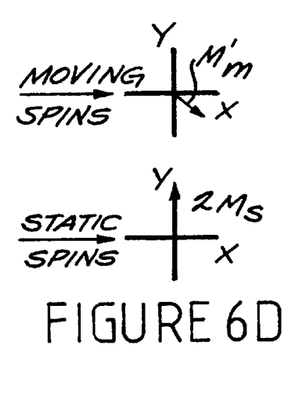
Figure 6E:
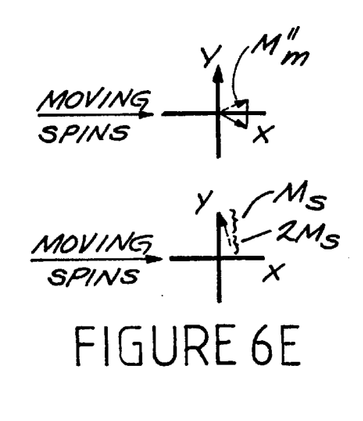
Figure 6F:
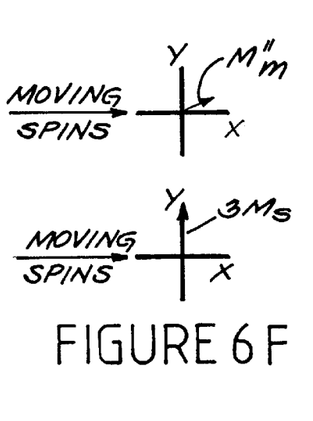
Figure 6G:
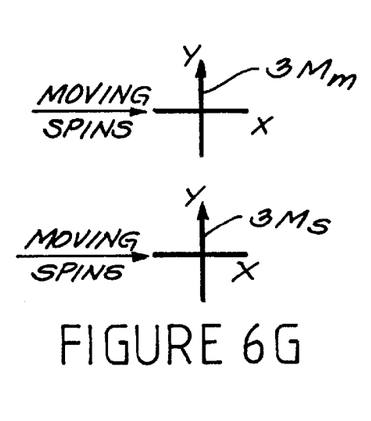

Referring to the graph set of FIG. 6C, the α pulse 56b moves more magnetization in the X-Y plane, which is aligned along the Y-axis for both static and moving spins. For the static spin case, the total magnetization is 2 $M_s$, whereas the magnetization for the moving spins is a resultant $M'_m$. This resultant is rotated by the Y-gradient bipolar pulses 62a–b, as shown by the graph set of FIG. 6D. The third α pulse 56c provides additional magnetism $M_m$ with respect to moving spins, which is added to the rotated magnetization as shown by the graph set of FIG. 6E. The magnetization $M''_m$ resulting therefrom is shown in the graph set of FIG. 6F for the moving spin case. However, as shown by FIG. 6F for the static case, the resultant magnetization thereof following the third α pulse 56c, is $3M_s$. Accordingly, the magnetization resulting from the moving spins, i.e., spins contained in flowing material, is significantly different (much shorter) than the magnetization for the static spins. The graph set of FIG. 6G depicts magnetization in the X-Y plane for moving and static spins, respectively, following the pulse sequence shown in FIG. 4B, i.e., following pulse 72. More particularly, the graphs of FIG. 6G show that the magnetization is flipped by pulse 72 in the same way for both flowing and static materials. By comparing the graph sets of FIGS. 6F and 6G it is seen that the pulse sequences of FIG. 4A and FIG. 4B give the same result for static spins, but not for moving ones.

To determine the presence of flowing material through the jth voxel, the signals $S_{1j}$ and $S_{2j}$ corresponding thereto could be compared, for example, by determining the difference therebetween. A difference of substantially zero would indicate that the jth voxel contained only static material, whereas a non-zero difference would indicate material flowing therethrough. By generating a set of such flow related information for each voxel within an imaging volume, an image may be readily constructed of flowing material, such as blood 53 flowing through vessel 52.

It is anticipated that other techniques for comparing signals $S_{1js}$ and $S_{2js}$, to determine the presence of flowing materials through respective voxels, will readily occur to those of skill in the art.

In a modification of the invention a bipolar gradient pulse, which is applied on the X gradient and which has an area that is half the one of 58a and 58b, is to be played out in the $T_2$ as well as the $T_2'$ intervals. Furthermore, a bipolar gradient pulse, which is applied on the Y gradient and which has an area that is the two thirds of the one of 62a and 62b, is played out in the $T_3$ as well as the $T_3$, intervals. These modifications provide the sequence of 'FIG. 4a with more isotropic sensitivity to flow.

Obviously, numerous other modifications and variations of the present invention are possible in light of the above teachings. It is therefore to be understood that within the scope of the disclosed concept, the invention may be practiced otherwise than as specifically described.

What is claimed is:

1. A method for use in constructing an MR image associated with an imaging volume containing static material, and also containing material flowing at a velocity having a direction defined with respect to first, second and third mutually orthogonal axes, said imaging volume comprising an array of voxels and said method comprising the steps of:

applying a first MR pulse sequence to said volume to produce a first MR data signal associated with given voxel, said first signal having a magnitude which encodes first and second flow parameters and a phase which encodes third flow parameter, said first, second, and third flow parameters representing the flow velocity of any flowing material present in said given voxel with respect to said first, second and third axes, respectively;

applying a second MR pulse sequence to said volume to produce a second MR data signal which indicates the content of said given voxel without flow encoding;

comparing said first and second MR data signals to determine whether any of said flowing material is present in said given voxel; and employing information generated by said comparing step in constructing an MR image wherein said flowing material is distinguished from said static material.

2. The method of claim 1 wherein:

said first, second and third flow parameters comprise the components of said flow velocity relative to X-, Y-, and Z- gradient axes, respectively, of an associated MR system.

3. The method of claim 2 wherein:

said first MR sequence comprises respective X-, Y-, and Z-gradient pulse pairs, RF excitation signals having first, second, and third flip angles respectively associated with said X-, Y-, and Z-gradient pulse pairs, and an RF inversion pulse associated with each of said X-and Y- gradient pulse pairs; and said second MR sequence comprises X- and Y- gradient pulse pairs which are substantially the same as the said X- and Y- gradient pulse pairs of said first MR sequence, respectively, an RF excitation signal having a flip angle which is substantially equal to the sum of said first, second, and third flip angles, and an RF inversion pulse associated with each of said X- and Y- gradient pulse pairs of said second MR sequence.

4. The method of claim 3 wherein:

said first, second, and third flip angles are all substantially equal to a specified flip angle value.

5. The method of claim 4 wherein:

each of said gradient pulse pairs of said first sequence is immediately preceded by its associated RF signal of said specified flip angle.

6. The method of claim 5 wherein:

said X- and Y- gradient pulse pairs each comprise two substantially identical gradient pulses of the same polarity, and said Z-gradient pulse pair comprises two substantially identical gradient pulses of opposite polarity.

7. The method of claim 3 wherein:

each of said inversion pulses of said first and second sequences occurs between the two gradient pulses of its associated gradient pulse pair.

8. The method of claim 4 wherein:

said flip angles are all substantially equal to an angle lying in the range 5°–10°.

9. The method of claim 1 wherein:

said comparing step comprises determining the difference between said first and second data signals, a non-zero difference indicating the presence of flowing material in said given voxel, and a substantially zero difference indicating the absence of flowing material from said given voxel.

10. In an arrangement wherein an MR imaging volume contains static material and also contains material flowing at a velocity having a direction defined with respect to first, second and third mutually orthogonal axes, and wherein said imaging volume comprises an array of voxels, a method for determining whether any of said flowing material is present in or absent from a given one of said voxels, said method comprising the steps of:

applying a first MR pulse sequence to said volume to produce a first MR data signal associated with said given voxel, said first signal having a magnitude which encodes first and second flow velocity components and a phase which encodes a third flow velocity component, said first, second and third flow velocity components representing the flow velocity of any flowing material present in said given voxel with respect to said first, second and third axes, respectively;

applying a second MR pulse sequence to said volume to produce a second MR data signal which indicates the content of said given voxel without flow encoding; and comparing said first and second MR data signals to determine the presence or absence of said flowing material with respect to said given voxel.

11. The method of claim 10 wherein:

said method includes the step of employing information generated by said comparing step for each voxel of said array to construct an MR image in which said flowing material is distinguished from said static material.

12. The method of claim 11 wherein:

said first, second and third velocity components represent said flow velocity with respect to the X-, Y-, and Z- gradient axes, respectively, of an associated MR system.

13. The method of claim 12 wherein:

said first MR sequence comprises respective X-, Y-, and Z- gradient pulse pairs and an RF inversion pulse associated with each of said X- and Y- gradient pulse pairs; and said second MR sequence comprises X- and Y- gradient pulse pairs which are substantially the same as said X- and Y- gradient pulse pairs of said first MR sequence, respectively, an RF inversion pulse being associated with each of said X- and Y- gradient pulse pairs of said second MR sequence.

14. The method of claim 13 wherein:

said X- and Y- gradient pulse pairs each comprises two substantially identical gradient pulses of the same polarity, and said Z- gradient pulse pair comprises two substantially identical gradient pulses of opposite polarity.

15. The method of claim 13 wherein:

each of said inversion pulses occurs between the two gradient pulses of its associated gradient pulse pair.

16. The method of claim 13 wherein:

said first MR sequence includes first, second and third flip angles respectively associated with said X-, Y- and Z- gradient pulse pairs of said first MR sequence; and said second MR sequence includes an RF excitation signal having a flip angle which is substantially equal to the sum of said first, second and third flip angles.

17. The method of claim 16 wherein:
each of said flip angles is substantially equal to an angle lying in the range of 5°–10°.
18. The method of claim 12 wherein:
said comparing step comprises determining the difference between said first and second data signals for respective voxels of said array, a non-zero difference for a particular voxel indicating the presence of flowing material therein, and a substantially zero difference indicating the absence of flowing material therefrom.

* * * * *